United States Patent
Tsubata et al.

(10) Patent No.: US 8,956,982 B2
(45) Date of Patent: Feb. 17, 2015

(54) MANUFACTURING METHOD OF SEMICONDUCTOR DEVICE

(75) Inventors: Shuichi Tsubata, Kanagawa (JP); Hirotaka Ogihara, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 601 days.

(21) Appl. No.: 13/300,262

(22) Filed: Nov. 18, 2011

(65) Prior Publication Data

US 2012/0244712 A1 Sep. 27, 2012

(30) Foreign Application Priority Data

Mar. 25, 2011 (JP) ................................. 2011-068502

(51) Int. Cl.
*H01L 21/31* (2006.01)
*H01L 21/033* (2006.01)
*H01L 27/10* (2006.01)
*H01L 45/00* (2006.01)
*H01L 27/24* (2006.01)

(52) U.S. Cl.
CPC .......... *H01L 21/0332* (2013.01); *H01L 27/101* (2013.01); *H01L 45/04* (2013.01); *H01L 45/1233* (2013.01); *H01L 45/146* (2013.01); *H01L 45/1675* (2013.01); *H01L 27/2409* (2013.01); *H01L 27/2481* (2013.01)
USPC .................................. 438/736; 257/E21.232

(58) Field of Classification Search
CPC .. H01L 45/04; H01L 45/1233; H01L 45/1675
USPC ........................... 438/592, 736; 257/E21.232
See application file for complete search history.

(56) References Cited

U.S. PATENT DOCUMENTS

| | | | | |
|---|---|---|---|---|
| 7,442,606 B2 * | 10/2008 | Lee | ............................... | 438/257 |
| 7,517,796 B2 * | 4/2009 | Raghuram et al. | ............ | 438/666 |
| 7,550,391 B2 * | 6/2009 | Jeon et al. | ..................... | 438/717 |
| 7,592,265 B2 * | 9/2009 | Wang et al. | ................... | 438/736 |
| 8,026,178 B2 * | 9/2011 | Nguyen et al. | ................ | 438/702 |
| 8,268,712 B2 * | 9/2012 | Hsu et al. | ...................... | 438/592 |
| 2001/0045646 A1 * | 11/2001 | Shields et al. | ................ | 257/734 |
| 2002/0003267 A1 * | 1/2002 | Lee et al. | ...................... | 257/388 |
| 2007/0142617 A1 | 6/2007 | Jung | | |
| 2008/0017992 A1 | 1/2008 | Kito et al. | | |
| 2008/0090418 A1 * | 4/2008 | Jeon et al. | ..................... | 438/689 |

(Continued)

FOREIGN PATENT DOCUMENTS

| | | |
|---|---|---|
| JP | 2003-31557 | 1/2003 |
| JP | 2007-161985 | 6/2007 |

(Continued)

*Primary Examiner* — Zandra Smith
*Assistant Examiner* — Toniae Thomas
(74) *Attorney, Agent, or Firm* — Finnegan, Henderson, Farabow, Garrett & Dunner, L.L.P.

(57) ABSTRACT

According to one embodiment, a stacked film including at least a silicon oxide film is formed by stacking a plurality of films formed of different materials and a hard mask pattern is formed on the stacked film. Then, a stacked film pattern of a predetermined shape is formed by performing anisotropic etching on the stacked film by using the hard mask pattern as an etching mask and the hard mask pattern is removed. The hard mask pattern is formed by stacking at least one first hard mask layer and at least one second hard mask layer. The first hard mask layer is formed of a material having a higher removability in wet etching than the second hard mask layer. The first hard mask layer is arranged immediately above the stacked film.

16 Claims, 5 Drawing Sheets

(56) References Cited

U.S. PATENT DOCUMENTS

| | | | |
|---|---|---|---|
| 2008/0197111 A1* | 8/2008 | Jung | 216/74 |
| 2008/0220616 A1* | 9/2008 | Matsui et al. | 438/736 |
| 2009/0081879 A1 | 3/2009 | Sukekawa | |
| 2010/0176368 A1* | 7/2010 | Ko et al. | 257/5 |
| 2010/0258878 A1* | 10/2010 | Mise et al. | 257/369 |
| 2010/0301421 A1* | 12/2010 | Kronholz et al. | 257/369 |
| 2010/0304542 A1* | 12/2010 | Beyer et al. | 438/299 |
| 2010/0327248 A1* | 12/2010 | Khoueir et al. | 257/2 |
| 2011/0089391 A1* | 4/2011 | Mihnea et al. | 257/2 |
| 2011/0095257 A1* | 4/2011 | Xu et al. | 257/3 |
| 2012/0168704 A1* | 7/2012 | Cholet | 257/1 |

FOREIGN PATENT DOCUMENTS

| | | |
|---|---|---|
| JP | 2007-335660 | 12/2007 |
| JP | 2008-27978 | 2/2008 |
| JP | 2009-76661 | 4/2009 |
| JP | 2009-283681 | 12/2009 |

* cited by examiner

US 8,956,982 B2

MANUFACTURING METHOD OF SEMICONDUCTOR DEVICE

CROSS-REFERENCE TO RELATED APPLICATIONS

This application is based upon and claims the benefit of priority from Japanese Patent Application No. 2011-068502, filed on Mar. 25, 2011; the entire contents of which are incorporated herein by reference.

FIELD

Embodiments described herein relate generally to a manufacturing method of a semiconductor device.

BACKGROUND

In manufacturing next generation three-dimensional memories and beyond, it is needed to etch a high aspect ratio shape. For example, in manufacturing an ReRAM, a stacked structure composed of a diode as a rectifier element, a variable resistive film, and a metal wire needs to be etched with a high aspect ratio. Moreover, with recent scaling of semiconductor devices, the aspect ratio of a processing shape tends to further increase.

For realizing processing of a high aspect ratio shape, a material having selectivity to a processing target film is preferably used as a hard mask for etching. However, the aspect ratio of a pattern of the hard mask itself becomes high for processing a high aspect ratio shape.

Conventionally, when processing a structure of an ReRAM, a stacked film of SiN and $SiO_2$ is used as a hard mask. The aspect ratio of a processing shape tends to become high also in an ReRAM and therefore the aspect ratio of a hard mask also becomes high. For example, in the case of processing a narrow line shape with a line width of about 24 nm, if a stacked film of SiN and $SiO_2$ is used as a hard mask, the aspect ratio of the hard mask becomes about 20. This is too large with respect to the aspect ratio of 10 that raises concerns about collapse. If the hard mask collapses during etching, desired processing cannot be performed.

Therefore, a manufacturing method of a semiconductor device capable of dealing with formation of a high aspect ratio shape is desired.

DETAILED DESCRIPTION

Figure 1A:
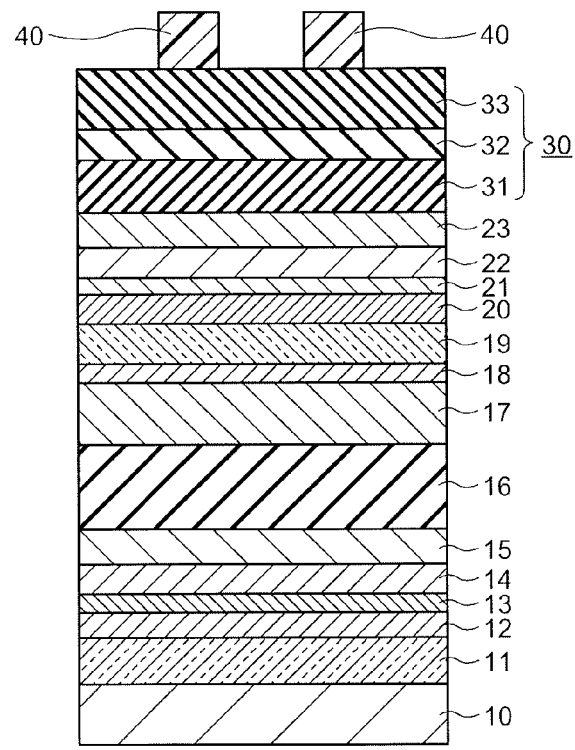
FIG. 1A to FIG. 1D are cross-sectional views illustrating a manufacturing process of a semiconductor device according to an embodiment.

In general, according to one embodiment, a stacked film including at least a silicon oxide film is formed by stacking a plurality of films formed of different materials and a hard mask pattern is formed on the stacked film. Then, a stacked film pattern of a predetermined shape is formed by performing anisotropic etching on the stacked film by using the hard mask pattern as an etching mask and the hard mask pattern is removed. The hard mask pattern is formed by stacking at least one first hard mask layer and at least one second hard mask layer. The first hard mask layer is formed of a material having a higher removability in wet etching than the second hard mask layer. The first hard mask layer is arranged immediately above the stacked film.

Exemplary embodiments of a manufacturing method of a semiconductor device will be explained below in detail with reference to the accompanying drawings. In the drawings illustrated below, the scale of each member is different from a realistic one in some cases for easy understanding. The same thing can be said between the drawings.

FIG. 1A to FIG. 1D are cross-sectional views illustrating a manufacturing process of a semiconductor device according to the embodiment. FIG. 1A to FIG. 1D illustrates a process of forming a stacked structure of an ReRAM including a rectifier element (diode), a barrier layer, a variable resistive film, and a metal wiring layer with a high aspect ratio. First, as shown in FIG. 1A, a polysilicon film 11 to be a rectifier element (diode) is formed on a base layer 10 formed on a not-shown semiconductor substrate, for example, by a CVD (Chemical Vapor Deposition) method. Next, a titanium nitride (TiN) film 12 to be a barrier layer is formed on the polysilicon film 11, for example, by a sputtering method.

Next, a variable resistive film 13 is formed on the titanium nitride film 12, for example, by a sputtering method. The variable resistive film is a variable resistive film whose main component is oxide containing at least one element selected from the group consisting of hafnium (Hf), zirconium (Zr), nickel (Ni), tantalum (Ta), tungsten (W), cobalt (Co), aluminum (Al), iron (Fe), manganese (Mn), chromium (Cr), and niobium (Nb) and which is capable of recording information by transitioning between a plurality of states having resistances different from each other by at least one of voltage to be applied and current to be conducted.

Next, a titanium nitride (TiN) film 14 to be a barrier layer is formed on the variable resistive film 13, for example, by a sputtering method. Next, a tungsten (W) film 15 to be a metal wiring layer is formed on the titanium nitride film 14, for example, by a sputtering method. Next, a silicon oxide ($SiC_2$) film 16 to be an intra-layer dielectric film is formed on the tungsten film 15, for example, by a plasma CVD method.

Next, a tungsten (W) film 17 to be a metal wiring layer is formed on the silicon oxide film 16, for example, by a sputtering method. Next, a titanium nitride (TiN) film 18 to be a barrier layer is formed on the tungsten film 17, for example, by a sputtering method. Next, a polysilicon film 19 to be a rectifier element (diode) is formed on the titanium nitride film 18, for example, by a CVD method.

Next, a titanium nitride (TiN) film 20 to be a barrier layer is formed on the polysilicon film 19, for example, by a sputtering method. Next, a variable resistive film 21 is formed on the titanium nitride film 20, for example, by a sputtering method. In the similar manner to the variable resistive film 13, the variable resistive film 21 is a variable resistive film whose main component is oxide containing at least one element selected from the group consisting of Hf, Zr, Ni, Ta, W, Co, Al, Fe, Mn, Cr, and Nb and which is capable of recording information by transitioning between a plurality of states having resistances different from each other by at least one of voltage to be applied and current to be conducted.

Next, a titanium nitride (TiN) film 22 to be a barrier layer is formed on the variable resistive film 21, for example, by a sputtering method. Next, a tungsten (W) film 23 to be a metal wiring layer is formed on the titanium nitride film 22, for example, by a sputtering method. A metal wiring layer is actually formed on the lower layer of the polysilicon film 11, however, it is formed in a process different from the manufacturing method of the semiconductor device according to the embodiment, so that the description is omitted.

Next, a hard mask film 30 is formed on the tungsten film 23. As the hard mask film 30, a stacked film, in which a silicon oxide film 31, an amorphous boron (amorphous boron: α-B) film 32, and a silicon oxide film 33 are stacked in this order, is formed, for example, by a plasma CVD method. The hard mask film 30 may be formed by other methods such as an LP-CVD (Low Pressure CVD) method.

Furthermore, as shown in FIG. 1A, line-shaped resist patterns 40 extending in a first direction are formed on the hard mask film 30 by a known lithography technology. The resist patterns 40 are formed at predetermined intervals in a second direction orthogonal to the first direction. The first direction is a direction vertical to the paper surface and the second direction is a horizontal direction in FIG. 1A.

Figure 1B:
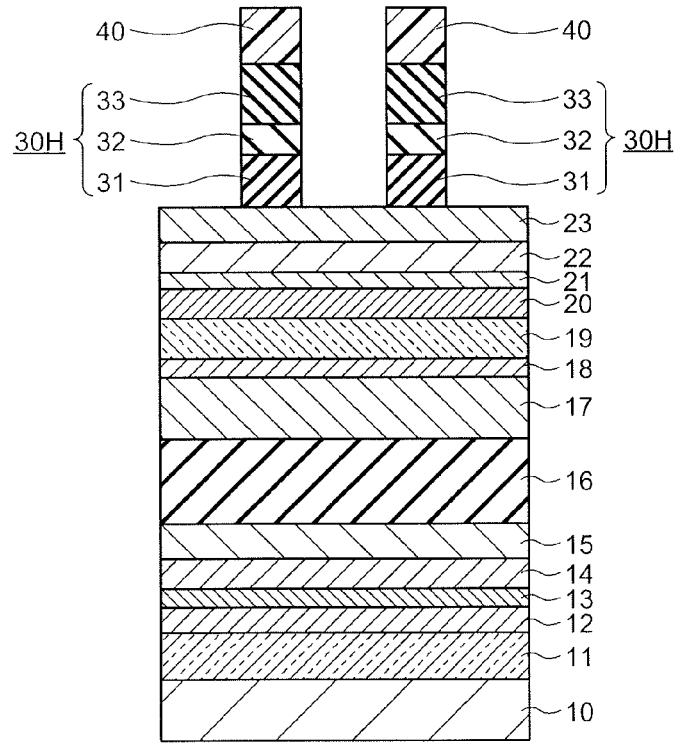

Next, as shown in FIG. 1B, the hard mask film 30 is etched by an RIE (Reactive Ion Etching) method using, for example, fluorine based gas with the resist patterns 40 as an etching mask to transfer the pattern of the resist patterns 40 onto the hard mask film 30. In this manner, mask patterns (hereinafter, hard mask patterns 30H) formed of the hard mask film 30 are obtained. The hard mask patterns 30H are line-shaped patterns extending in the first direction. Thereafter, the resist patterns 40 are stripped, for example, by using peroxomonosulfuric acid (mixture of sulfuric acid and hydrogen peroxide solution).

Figure 1C:
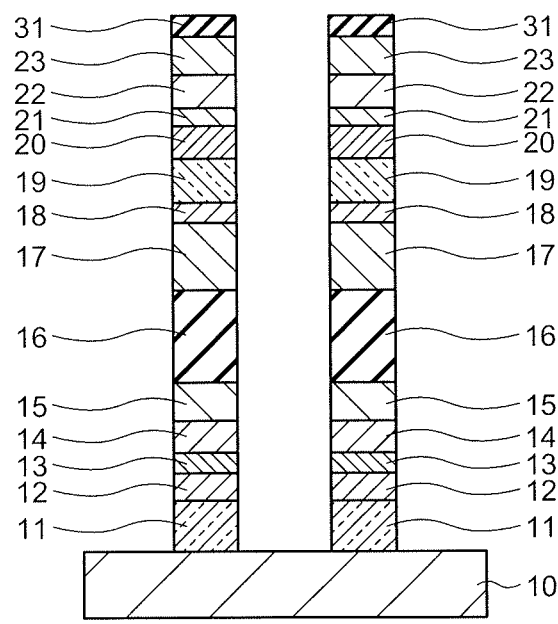
Figure 1D:
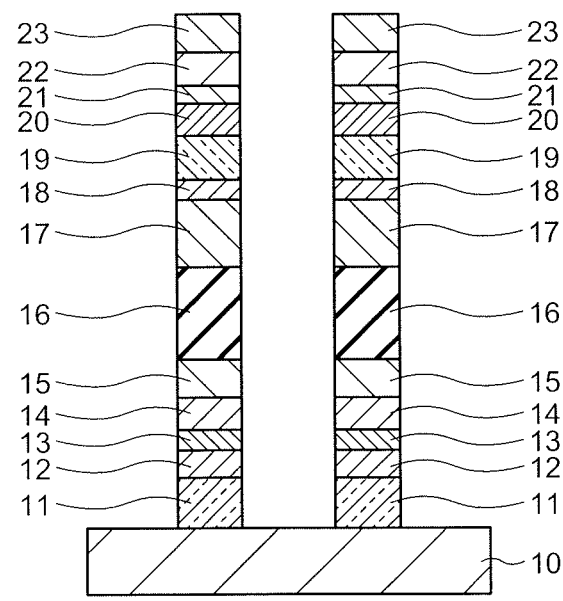

Next, the stacked film from the tungsten film 23 to the polysilicon film 11 is etched by anisotropic etching with the hard mask patterns 30H as an etching mask to transfer the pattern of the hard mask patterns 30H onto the stacked film as shown in FIG. 1C. As the anisotropic etching, for example, an RIE method that is a dry etching method is used. In this embodiment, the stacked film from the tungsten film 23 to the polysilicon film 11 is collectively processed.

In this etching, the amorphous boron film 32 is used as an etching mask for etching the silicon oxide film 16 among the layers from the tungsten film 23 to the polysilicon film 11. Moreover, the silicon oxide film 31 and the silicon oxide film 33 are used as an etching mask for etching other layers.

Moreover, each layer of the stacked film is processed under the gas conditions suitable for the material. Etching of the polysilicon film 11 and the polysilicon film 19 is performed, for example, by using fluorine based gas. Etching of the titanium nitride film 12, the titanium nitride film 14, the titanium nitride film 18, the titanium nitride film 20, and the titanium nitride film 22 is performed, for example, by using chlorine based gas. Etching of the variable resistive film 13 and the variable resistive film 21 is performed, for example, by using chlorine based gas. Etching of the tungsten film 15, the tungsten film 17, and the tungsten film 23 is performed, for example, by using fluorine based gas. Etching of the silicon oxide film 16 is performed, for example, by using chlorine based gas.

The hard mask pattern 30H is a line-shaped pattern extending in the first direction. Therefore, the stacked film from the tungsten film 23 to the polysilicon film 11 is processed into a line shape extending in the first direction. In other words, each layer is processed at predetermined intervals to be located in the processing positions of the polysilicon film 11 in the second direction orthogonal to the first direction in a plane direction of the semiconductor substrate as shown in FIG. 1C.

Thereafter, the hard mask patterns 30H remaining on the tungsten film 23 are removed by wet etching, thereby obtaining stacked films as line-shaped patterns extending in the first direction as shown in FIG. 10. In other words, a stacked structure with a high aspect ratio including the stacked films from the tungsten film 23 to the polysilicon film 11 is formed.

On the tungsten film 23 after etching, only the silicon oxide film 31 remains as the hard mask patterns 30H. Therefore, this silicon oxide film 31 is removed by using hydrofluoric acid based chemical. As the hydrofluoric acid based chemical, for example, hydrofluoric acid, buffered hydrofluoric acid, or dilute hydrofluoric acid can be used.

In the above embodiment, the hard mask pattern 30H, which is the stacked film in which the silicon oxide film 31, the amorphous boron film 32, and the silicon oxide film 33 are stacked, is used as an etching mask. In this case, if the film thickness of the hard mask film 30 necessary for etching the stacked film from the tungsten film 23 to the polysilicon film 11 is set 1, the necessary film thickness of a hard mask becomes about 1.8 when performing etching processing under the same conditions by using a hard mask composed of a silicon oxide film as an etching mask as in the conventional technology. This is calculated by obtaining values of the etch rate of a silicon oxide film and an amorphous boron film with respect to each film.

The selectivity of an amorphous boron film to a silicon oxide film (etch rate of a silicon oxide film/etch rate of an amorphous boron film) in etching by an RIE method is five. Therefore, an amorphous boron film is excellent as a hard mask material when etching a silicon oxide film. However, a silicon oxide film has high selectivity to the material films other than the silicon oxide film composing the above stacked film from the tungsten film 23 to the polysilicon film 11 compared with an amorphous boron film.

Therefore, it is possible to make the necessary film thickness of a hard mask small by using the hard mask patterns 30H, in which the silicon oxide film 31, the amorphous boron film 32, and the silicon oxide film 33 are stacked, as an etching mask, using the amorphous boron film 32 as an etching mask for the silicon oxide film 16, and using the silicon oxide film 31 and the silicon oxide film 33 as an etching mask for each of the other layers.

Figure 2:
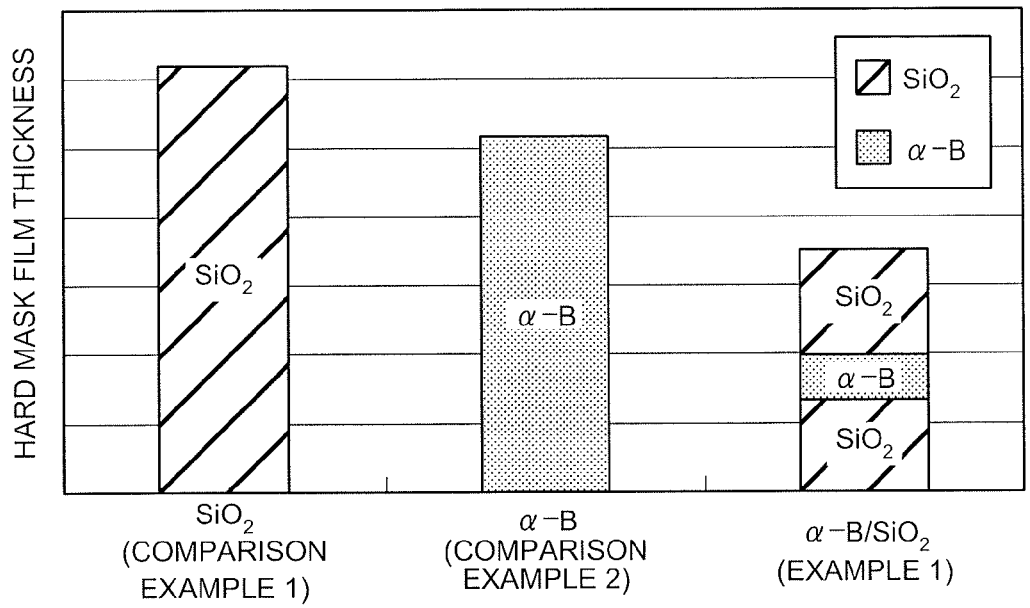
FIG. 2 is a diagram illustrating configurations of hard masks and the film thickness of the hard masks necessary for etching.

FIG. 2 is a diagram illustrating configurations of hard masks and the film thickness of the hard masks necessary for etching. FIG. 2 illustrates the film thickness necessary for etching the stacked film from the tungsten film 23 to the polysilicon film 11 by an RIE method under the same conditions as the above for the hard masks having different configurations. Three types of the hard masks, that is, a hard mask (Comparison Example 1) composed of only a silicon oxide film, a hard mask (Comparison Example 2) composed of only an amorphous boron film, and the above-described hard mask film 30 (Example 1) that is a hard mask composed of a stacked film of a silicon oxide film and an amorphous boron film are used.

As shown in FIG. 2, if the necessary film thickness of a hard mask in Example 1 is set 1, the necessary film thickness is about 1.8 in Comparison Example 1 and is about 1.5 in Comparison Example 2. These are calculated by obtaining values of the etch rate of a silicon oxide film and an amorphous boron film under the above processing conditions with respect to each film from the tungsten film 23 to the polysilicon film 11.

Moreover, as for the hard mask film in Example 1, the amorphous boron film 32 is used as an etching mask in etching of the silicon oxide film 16 among the layers from the tungsten film 23 to the polysilicon film 11 and the silicon oxide film 31 and the silicon oxide film 33 are used as an etching mask in etching of each of the other layers.

Moreover, as for the aspect ratio of a hard mask when a line-shaped hard mask having a predetermined line width is formed with these thicknesses, the aspect ratio is 12.9 in the case of the hard mask in Comparison Example 1, the aspect ratio is 10.8 in the case of the hard mask in Comparison Example 2, and the aspect ratio is 7.3 in the case of Example 1. Therefore, the aspect ratio of a hard mask can be suppressed to a practical level, with which there is no concern of collapse, by using the hard mask in Example 1. Moreover, when the hard mask in Comparison Example 2 is used, although the aspect ratio is larger than the aspect ratio of 10 that raises concerns about collapse, it is possible to suppress the aspect ratio of a hard mask to a level near a practical level compared with the hard mask in Comparison Example 1.

This is due to the effect that an amorphous boron film is harder than a silicon oxide film and thus has high etch selectivity. The hardness of an amorphous boron film is about 30 GPa. The hardness of a silicon oxide film is about 0.5 to 9 GPa although the value slightly varies depending on a manufacturing method. The hardness in this embodiment is the hardness by a nano indenter.

Figure 3:
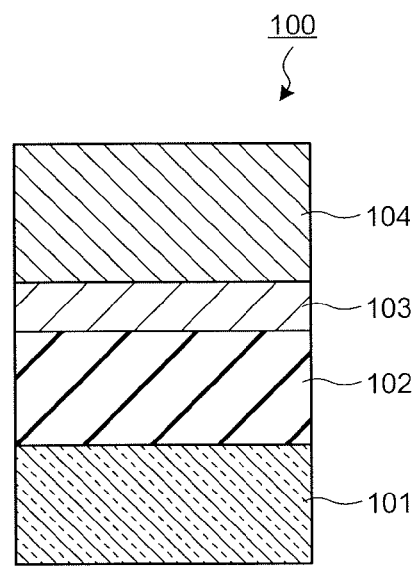
FIG. 3 is a cross-sectional view illustrating a configuration of a stacked film as a processing target film.
Figure 4:
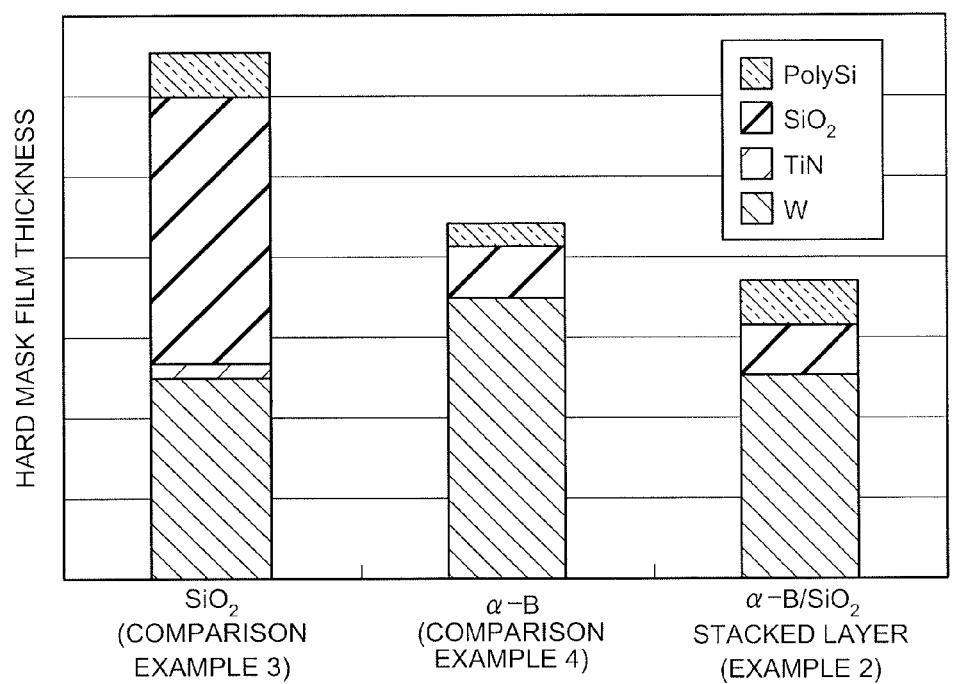
FIG. 4 is a diagram illustrating configurations of hard masks and estimated values of the film thickness of the hard masks necessary for etching each layer of the stacked film shown in FIG. 3.

Next, the hard mask film thickness necessary when etching various material films is explained. FIG. 3 is a cross-sectional view illustrating a configuration of a stacked film 100 as a processing target film. The stacked film 100 is formed by stacking a polysilicon film 101, a silicon oxide film 102, a titanium nitride film 103, and a tungsten film 104. FIG. 4 is a diagram illustrating configurations of hard masks and estimated values of the film thickness of the hard masks necessary for etching each layer of the stacked film 100 shown in FIG. 3. The film thickness of the hard masks is calculated by obtaining values of the etch rate of the polysilicon film 101, the silicon oxide film 102, the titanium nitride film 103, and the tungsten film 104. In FIG. 4, the breakdown of the film thickness of the hard masks is indicated by hatching corresponding to each layer of the stacked film 100.

In the similar manner to the case of FIG. 2, three types of the hard masks, that is, a hard mask (Comparison Example 3) composed of only a silicon oxide film, a hard mask (Comparison Example 4) composed of only an amorphous boron film, and a hard mask (Example 2) composed of a stacked film of a silicon oxide film and an amorphous boron film are used. In the hard mask in Example 2, a silicon oxide film, an amorphous boron film, and a silicon oxide film are stacked in this order.

Moreover, as for the hard mask in Example 2, the amorphous boron film is used as an etching mask in etching of the silicon oxide film 102 and the titanium nitride film 103 among the layers of the stacked film 100 and the silicon oxide film is used as an etching mask in etching of each of the other layers.

As shown in FIG. 4, in Comparison Example 4 and Example 2, the film thickness of a hard mask necessary for etching the silicon oxide film 102 decreases largely compared with Comparison Example 3. This is due to the effect that an amorphous boron film is harder than a silicon oxide film and thus has high etch selectivity. Moreover, in Comparison Example 4 and Example 2, the film thickness of a hard mask necessary for etching the titanium nitride film 103 decreases largely compared with Comparison Example 3. This is because when an amorphous boron film is used as an etching mask, a hard mask film is ground little in etching of the titanium nitride film 103.

Moreover, the film thickness of a hard mask necessary for etching the tungsten film 104 increases by about 40% in Comparison Example 4 compared with Comparison Example 3, however, the necessary film thickness in Example 2 is the same as Comparison Example 3. This is because a silicon oxide film has high selectivity to the material films other than the silicon oxide film compared with an amorphous boron film. The film thickness of a hard mask necessary for etching the whole stacked film 100 is reduced by about ⅓ in Comparison Example 4 compared with Comparison Example 3 and is reduced to about ½ in Example 2 compared with Comparison Example 3. This effect is obtained because an amorphous boron film is harder than a silicon oxide film.

Moreover, although not shown in FIG. 4, as for a metal oxide film whose main component is oxide containing at least one element selected from the group consisting of Hf, Zr, Ni, Ta, W, Co, Al, Fe, Mn, Cr, and Nb and which is capable of recording information by transitioning between a plurality of states having resistances different from each other by at least one of voltage to be applied and current to be conducted, the film thickness of a hard mask necessary for etching is estimated. As a result, the film thickness of the hard mask in Example 2 becomes about ½ compared with the hard mask in Comparison Example 3.

However, because there is no chemical that can etch an amorphous boron film, the amorphous boron film cannot be stripped and removed by wet etching. Therefore, when the hard mask in Comparison Example 4 is used, the hard mask remaining on the processing target film cannot be removed.

On the other hand, when the hard mask in Example 2 is used, only part of the silicon oxide film remains on the processing target film when desired etching is finished. A silicon oxide film has a higher removability in wet etching than an amorphous boron film and can be easily removed by using hydrofluoric acid based chemical. In other words, in the case where the hard mask in Example 2 is used, for example, even when a line-shaped hard mask with a line width of 24 nm is formed, the aspect ratio of the hard mask can be suppressed to a practical level. A remaining film of the hard mask remaining on the processing target film after finishing etching can be easily removed.

Therefore, with the use of the hard mask in Example 2, for example, even when a narrow line-shaped hard mask with a line width of 30 nm or less is formed, it is possible to realize the aspect ratio of a practical level with which there is no concern of collapse. Moreover, a remaining film of the hard mask after finishing etching can be easily removed.

As an amorphous boron film used in a hard mask in the present embodiment, amorphous boron in which nitrogen (N) and hydrogen (H) are mixed can also be used other than pure amorphous boron.

Moreover, the above description illustrates the hard mask patterns 30H in which the silicon oxide film 31, the amorphous boron ($\alpha$-B) film 32, and the silicon oxide film 33 are stacked on the processing target film in this order, however, a hard mask satisfying the following conditions can obtain the effect similar to the hard mask patterns 30H with respect to a processing target film including at least a silicon oxide film. The first condition is that a hard mask is formed by stacking at least one first hard mask layer and at least one second hard mask layer with the first hard mask layer as a lowermost layer. The second condition is that the first hard mask layer is stripped easier than the second hard mask layer in wet etching (excellent in removability). The third condition is that the first hard mask layer is stacked immediately above the processing target film.

As such a first hard mask layer, an SiN film or an amorphous silicon (α-Si) film can be used other than a silicon oxide film. In this case also, the effect similar to the above-described hard mask patterns 30H can be obtained. Moreover, the hard mask patterns 30H may be formed by using a stacked film, in which these films containing silicon are stacked, instead of the silicon oxide film 31 and the silicon oxide film 33. In this case also, the effect similar to the above can be obtained.

Moreover, as the second hard mask layer, an SiBN film or a BN film can be used other than an amorphous boron film. In this case also, the effect similar to the above-described hard mask patterns 30H can be obtained. Moreover, the hard mask patterns 30H may be formed by using a stacked film, in which these films containing boron are stacked, instead of the amorphous boron film 32. In this case also, the effect similar to the above can be obtained.

Figure 5:
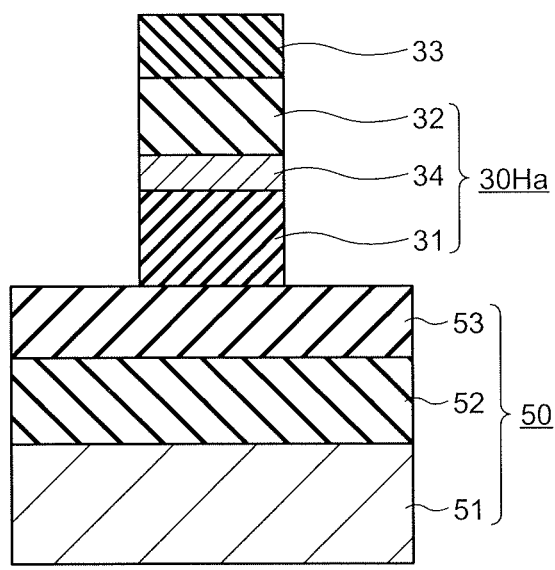
FIG. 5 is a schematic diagram illustrating a configuration of another hard mask according to the embodiment.

Furthermore, for example, at least one another hard mask layer formed of a metal film or the like different from the material of the first hard mask layer and the second hard mask layer described above may be further stacked. FIG. 5 is a schematic diagram illustrating a configuration of a hard mask pattern 30Ha as another hard mask according to the embodiment. The hard mask pattern 30Ha shown in FIG. 5 is formed by stacking the silicon oxide film 31, a metal film 34, the amorphous boron film 32, and the silicon oxide film 33. Even when etching by an RIE is performed, for example, on a processing target film 50, in which a metal film 51 such as titanium (Ti) and aluminum (Al), a silicon oxide film 52, and a silicon nitride film 53 are stacked as shown in FIG. 5, with the hard mask pattern 30Ha as an etching mask, the effect similar to the hard mask pattern 30H can be obtained.

Moreover, for example, when the uppermost layer of the processing target film is a silicon oxide film, the first hard mask layer to be a lowermost layer of a hard mask is formed of a silicon nitride film. Consequently, stripping processing of a remaining film of the hard mask after etching of the processing target film does not affect the surface layer of the processing target film.

Figure 6:
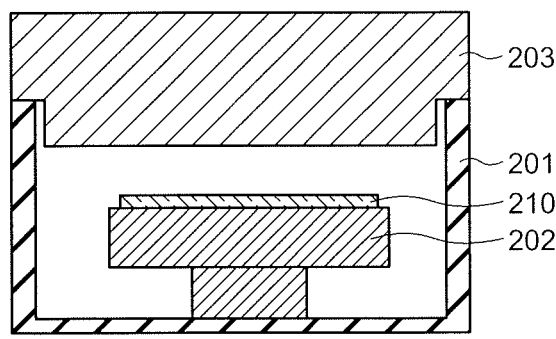
FIG. 6 is a schematic diagram illustrating a schematic configuration of a thin-film forming apparatus capable of forming an amorphous boron film and a silicon oxide film.

Next, a method of forming the silicon oxide film and the amorphous boron film of the hard mask film 30 is explained. FIG. 6 is a schematic diagram illustrating a schematic configuration of a plasma CVD apparatus that is a thin-film forming apparatus capable of forming an amorphous boron film and a silicon oxide film. In the plasma CVD apparatus shown in FIG. 6, a lower electrode 202, which also functions as a heater to heat a film forming substrate 210, is arranged in the lower area in a reaction chamber 201 capable of maintaining a vacuum of 10 Torr or less. The film forming substrate 210 is placed on the lower electrode 202. Moreover, in the upper area of the reaction chamber 201, an upper electrode 203 is arranged parallel to the lower electrode 202. The lower electrode 202 and the upper electrode 203 form a parallel plate electrode. Moreover, a not-shown exhaust unit, which exhausts gas in the reaction chamber 201, is connected to the reaction chamber 201.

First, when forming a silicon oxide film, gas in the reaction chamber 201 is exhausted by the exhaust unit to set the inside of the reaction chamber 201 to a predetermined degree of vacuum. Next, the film forming substrate 210 placed on the lower electrode 202 is heated, for example, to 400° C. to 550° C. Next, a mixed gas of $SiH_4$, $N_2O$, and $CO_2$ is introduced into the reaction chamber 201 from a gas source (not shown) and the pressure in the reaction chamber 201 is kept constant. Then, in this state, high frequency power is supplied between the upper electrode 203 and the lower electrode 202 from a power source (not shown) to generate plasma in the reaction chamber 201. Consequently, a silicon oxide film is formed on the film forming substrate 210.

An SiN film and an amorphous silicon film are formed in the similar procedure. When forming an SiN film, for example, a mixed gas of $SiH_4$, $NH_3$, and $N_2$ is introduced into the reaction chamber 201. When forming an amorphous silicon film, for example, a mixed gas of $SiH_4$ and Ar is introduced into the reaction chamber 201. Moreover, these films can be formed in the same reaction chamber 201 sequentially in any order. The following two effects can be obtained by forming these films in the same reaction chamber 201 sequentially without being exposed to the atmosphere. The first effect is that because absorption of water or the like in the film surface on the lower layer side can be prevented when forming these films in a stacked manner, adhesion at an interface between these stacked films becomes higher than the case where the films are formed while being exposed to the atmosphere. The second effect is that the film forming process can be made efficient by sequentially forming different types of films in the same reaction chamber 201.

When forming an amorphous boron film, gas in the reaction chamber 201 is exhausted by the exhaust unit to set the inside of the reaction chamber 201 to a predetermined degree of vacuum. Next, the film forming substrate 210 placed on the lower electrode 202 is heated, for example, to 400° C. to 550° C. Next, a mixed gas of $B_2H_6$ and $N_2$ is introduced into the reaction chamber 201 from the gas source and the pressure in the reaction chamber 201 is kept constant. Then, in this state, high frequency power is supplied between the upper electrode 203 and the lower electrode 202 from the power source (not shown) to generate plasma in the reaction chamber 201. Consequently, an amorphous boron film is formed on the film forming substrate 210.

An SiBN film and a BN film are formed in the similar procedure. When forming an SiBN film, for example, a mixed gas of $SiH_4$, $B_2H_6$, $NH_3$, and $N_2$ is introduced into the reaction chamber 201. When forming a BN film, for example, a mixed gas of $B_2H_6$, $NH_3$, and $N_2$ is introduced into the reaction chamber 201.

With the use of such a plasma CVD apparatus, the above-described films can be formed in the same reaction chamber 201 sequentially in any order. The following two effects can be obtained by forming these films in the same reaction chamber 201 sequentially without being exposed to the atmosphere. The first effect is that because absorption of water or the like in the film surface on the lower layer side can be prevented when forming these films in a stacked manner, adhesion at an interface between these stacked films becomes higher than the case where the films are formed while being exposed to the atmosphere. The second effect is that the film forming process can be made efficient by sequentially forming different types of films in the same reaction chamber 201.

As above, according to the present embodiment, the hard mask patterns 30H, in which the silicon oxide film 31, the amorphous boron film 32, and the silicon oxide film 33 are stacked, are used in anisotropic etching of a stacked film including a silicon oxide film. Therefore, the aspect ratio of a hard mask can be reduced to a practical level by reducing the film thickness of the hard mask. Consequently, narrow line-shaped patterns can be collectively processed by anisotropic etching, enabling to form a stacked structure with a high aspect ratio including a silicon oxide film.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device comprising:
 forming a stacked film including at least a silicon oxide film by stacking a plurality of films formed of different materials;
 forming a hard mask pattern on the stacked film;
 forming a stacked film pattern of a predetermined shape by performing anisotropic etching on the stacked film by using the hard mask pattern as an etching mask; and
 removing the hard mask pattern, wherein
 the hard mask pattern is formed by stacking at least one first hard mask layer and at least one second hard mask layer,
 the first hard mask layer is formed of a material having a higher removability in wet etching than the second hard mask layer,
 the first hard mask layer is arranged immediately above the stacked film,
 the first hard mask layer is formed by stacking one or a plurality of films from among a silicon oxide film, a silicon nitride film, and an amorphous silicon film, and
 the second hard mask layer is formed by an amorphous boron film.

2. The method according to claim 1, wherein
 the first hard mask layer is formed of a silicon oxide film, and
 the first hard mask layer remaining on the stacked film pattern after forming the stacked film pattern is removed by wet etching.

3. The method according to claim 1, wherein
 an uppermost layer of the stacked film is a silicon oxide film, and
 the first hard mask layer immediately above the stacked film is a silicon nitride film.

4. A method of manufacturing a semiconductor device, comprising:
 forming a stacked film including at least a silicon oxide film by stacking a plurality of films formed of different materials;
 forming a hard mask pattern on the stacked film;
 forming a stacked film pattern of a predetermined shape by performing anisotropic etching on the stacked film by using the hard mask pattern as an etching mask; and
 removing the hard mask pattern, wherein
 the hard mask pattern is formed by stacking at least one first hard mask layer and at least one second hard mask layer,
 the first hard mask layer is formed of a material having a higher removability in wet etching than the second hard mask layer,
 the first hard mask layer is arranged immediately above the stacked film, and
 the second hard mask layer has a higher selectivity to silicon oxide in the anisotropic etching than the first hard mask layer.

5. The method according to claim 1, wherein the anisotropic etching is an RIE (Reactive Ion Etching).

6. The method according to claim 5, wherein
 the silicon oxide film in the stacked film is etched by using the second hard mask layer as an etching mask, and
 a film other than the silicon oxide film in the stacked film is etched by using the first hard mask layer as an etching mask.

7. The method according to claim 6, wherein the silicon oxide film is etched by using a chlorine based gas.

8. The method according to claim 6, wherein the stacked film includes an oxide film whose main component is oxide containing at least one element selected from a group consisting of hafnium, zirconium, nickel, tantalum, tungsten, cobalt, aluminum, iron, manganese, chromium, and niobium.

9. The method according to claim 8, wherein the oxide film is etched by using a chlorine based gas.

10. The method according to claim 5, wherein
 the stacked film includes a titanium nitride film,
 the silicon oxide film and the titanium nitride film in the stacked film are etched by using the second hard mask layer as an etching mask, and
 a film other than the silicon oxide film and the titanium nitride film in the stacked film is etched by using the first hard mask layer as an etching mask.

11. The method according to claim 10, wherein the silicon oxide film and the titanium nitride film are etched by using a chlorine based gas.

12. The method according to claim 1, wherein, in the hard mask pattern, at least one hard mask layer, formed of a material different from the material of the first hard mask layer and different from a material of the second hard mask layer, is further stacked.

13. The method according to claim 1, wherein the plurality of films from among a silicon oxide film, a silicon nitride film, and an amorphous silicon film is formed sequentially in a same film formation chamber without being exposed to an atmosphere to form the first hard mask layer.

14. The method according to claim 4, wherein a plurality of films from among an amorphous boron film, a silicon boron nitride film, and a boron nitride film is formed sequentially in a same film formation chamber without being exposed to an atmosphere to form the second hard mask layer.

15. The method according to claim 4, wherein
 the first hard mask layer is formed of a silicon oxide film, and
 the first hard mask layer remaining on the stacked film pattern after forming the stacked film pattern is removed by wet etching.

16. The method according to claim 4, wherein
 an uppermost layer of the stacked film is a silicon oxide film, and
 the first hard mask layer immediately above the stacked film is a silicon nitride film.

* * * * *